(12) United States Patent
Tajima et al.

(10) Patent No.: US 10,651,307 B2
(45) Date of Patent: May 12, 2020

(54) SEMICONDUCTOR DEVICE AND METHOD FOR MANUFACTURING THE SAME

(71) Applicant: Kabushiki Kaisha Toshiba, Minato-ku (JP)

(72) Inventors: Jumpei Tajima, Mitaka (JP); Toshiki Hikosaka, Kawasaki (JP); Masahiko Kuraguchi, Yokohama (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/291,368

(22) Filed: Mar. 4, 2019

(65) Prior Publication Data

US 2020/0027977 A1 Jan. 23, 2020

(30) Foreign Application Priority Data

Jul. 23, 2018 (JP) ................. 2018-137971

(51) Int. Cl.
*H01L 29/778* (2006.01)
*H01L 29/66* (2006.01)
*H01L 29/205* (2006.01)
*H01L 29/20* (2006.01)

(52) U.S. Cl.
CPC ...... *H01L 29/7787* (2013.01); *H01L 29/2003* (2013.01); *H01L 29/205* (2013.01); *H01L 29/66462* (2013.01)

(58) Field of Classification Search
CPC ....... H01L 2924/00014; H01L 29/2003; H01L 33/62; H01L 2224/13111; H01L 29/66462
See application file for complete search history.

(56) References Cited

U.S. PATENT DOCUMENTS

| 7,170,111 | B2 | 1/2007 | Saxler |
| 7,612,390 | B2 | 11/2009 | Saxler et al. |
| 2010/0187540 | A1 | 7/2010 | Ishibashi et al. |

(Continued)

FOREIGN PATENT DOCUMENTS

| JP | 2002-094112 A | 3/2002 |
| JP | 2009-200523 A | 9/2009 |

(Continued)

*Primary Examiner* — Tony Tran
(74) *Attorney, Agent, or Firm* — Oblon, McClelland, Maier & Neustadt, L.L.P.

(57) ABSTRACT

According to one embodiment, a semiconductor device includes first to third electrodes, first to fifth layers, and an insulating portion. A position of the third electrode is between a position of the first electrode and a position of the second electrode. The first layer includes first to fifth partial regions. The first partial region is between the fourth and third partial regions. The second partial region is between the third and fifth partial regions. The second layer includes first and second semiconductor regions. The third layer is provided between the third partial region and the third electrode. The fourth layer is provided between the third partial region and the third layer. The fifth layer includes first and second intermediate regions. The third layer is provided between the first and second intermediate regions. The insulating portion includes a first insulating region provided between the third layer and the third electrode.

17 Claims, 7 Drawing Sheets

(56) References Cited

U.S. PATENT DOCUMENTS

| | | | |
|---|---|---|---|
| 2011/0133209 A1 | 6/2011 | Ishibashi et al. | |
| 2013/0234151 A1 | 9/2013 | Hikosaka et al. | |
| 2013/0237036 A1 | 9/2013 | Hikosaka et al. | |
| 2013/0256681 A1 | 10/2013 | Wang et al. | |
| 2014/0175456 A1* | 6/2014 | Kuraguchi | H01L 29/2003 |
| | | | 257/76 |
| 2015/0200255 A1 | 7/2015 | Hikosaka et al. | |

FOREIGN PATENT DOCUMENTS

| | | |
|---|---|---|
| JP | 2009-246038 A | 10/2009 |
| JP | 2012-164988 A | 8/2012 |
| JP | 2012-248632 A | 12/2012 |
| JP | 2013-187427 A | 9/2013 |
| JP | 2013-187428 A | 9/2013 |
| JP | 2015-133443 A | 7/2015 |
| JP | 2017-59598 A | 3/2017 |

\* cited by examiner

US 10,651,307 B2

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2018-137971, filed on Jul. 23, 2018; the entire contents of which are incorporated herein by reference.

FIELD

Embodiments described herein relate generally to a semiconductor device and a method for manufacturing the same.

BACKGROUND

For example, there is a semiconductor device using a nitride semiconductor. It is desirable to improve the characteristics of the semiconductor device.

DETAILED DESCRIPTION

Figure 1:
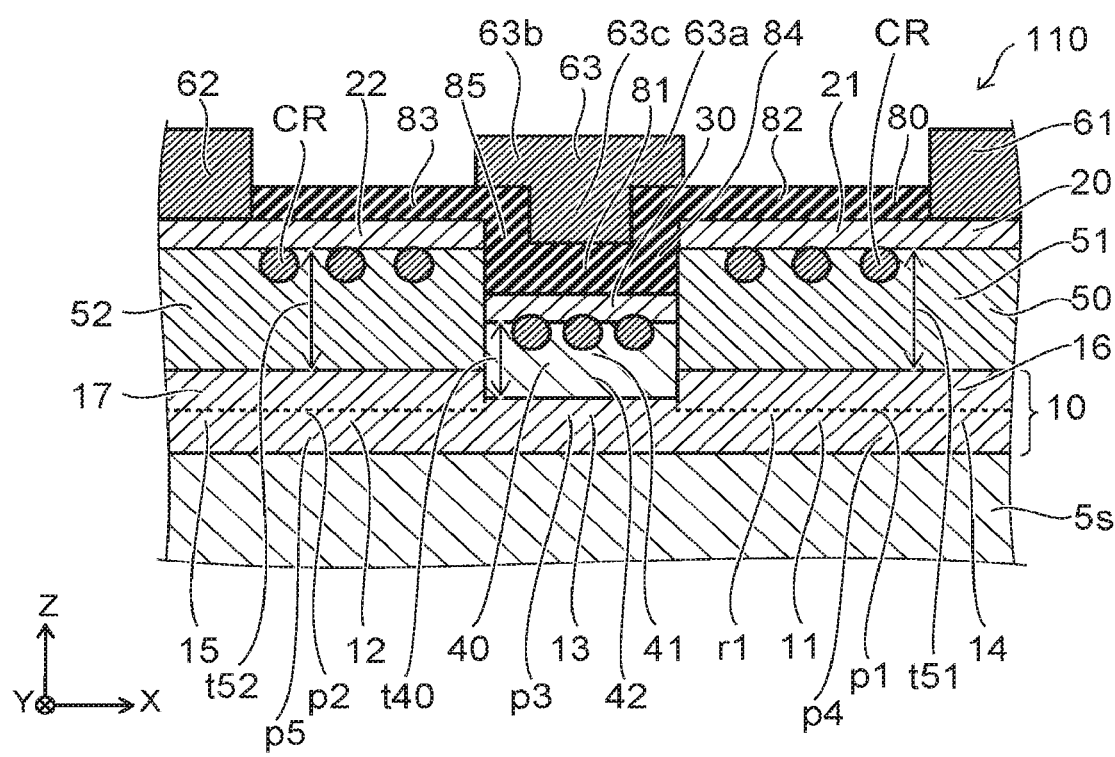
FIG. 1 is a schematic cross-sectional view illustrating a semiconductor device according to a first embodiment.

According to one embodiment, a semiconductor device includes first to third electrodes, first to fifth layers, and an insulating portion. A direction from the second electrode toward the first electrode is aligned with a first direction. A position in the first direction of the third electrode is between a position in the first direction of the first electrode and a position in the first direction of the second electrode. The first layer includes $Al_{x1}Ga_{1-x1}N$ ($0<x1\leq1$). The first layer includes first to fifth partial regions. A direction from the fourth partial region toward the first electrode, a direction from the fifth partial region toward the second electrode, and a direction from the third partial region toward the third electrode are aligned with a second direction crossing the first direction. The first partial region is between the fourth partial region and the third partial region in the first direction. The second partial region is between the third partial region and the fifth partial region in the first direction. The second layer includes $Al_{x2}Ga_{1-x2}N$ ($0<x2\leq1$). The second layer includes a first semiconductor region and a second semiconductor region. A direction from the first partial region toward the first semiconductor region and a direction from the second partial region toward the second semiconductor region are aligned with the second direction. The third layer includes $Al_{x3}Ga_{1-x3}N$ ($0<x3\leq1$). The third layer is provided between the third partial region and the third electrode in the second direction. The fourth layer includes $Al_{x4}Ga_{1-x4}N$ ($0\leq x4<1$, $x4<x1$, $x4<x2$, and $x4<x3$). The fourth layer is provided between the third partial region and the third layer in the second direction. The fifth layer includes $Al_{x5}Ga_{1-x5}N$ ($0\leq x5<1$, $x5<x1$, $x5<x2$, and $x5<x3$). The fifth layer includes a first intermediate region and a second intermediate region. The first intermediate region is provided between the first partial region and the first semiconductor region in the second direction. The second intermediate region is provided between the second partial region and the second semiconductor region in the second direction. The third layer is provided between the first intermediate region and the second intermediate region in the first direction. The insulating portion includes a first insulating region provided between the third layer and the third electrode in the second direction. A first concentration of a first element at a first position inside the first partial region is higher than a third concentration of the first element at a third position inside the third partial region. A direction from the third position toward the first position is aligned with the first direction. The first element includes at least one selected from the group consisting of silicon, oxygen, carbon, and magnesium.

According to another embodiment, a semiconductor device includes first to third electrodes, first to fourth layers, and an insulating portion. A direction from the second electrode toward the first electrode is aligned with a first direction. A position in the first direction of the third electrode is between a position in the first direction of the first electrode and a position in the first direction of the second electrode. The first layer includes $Al_{x1}Ga_{1-x1}N$ ($0<x1\leq1$). The first layer includes first to fifth partial regions. A direction from the fourth partial region toward the first electrode, a direction from the fifth partial region toward the second electrode, and a direction from the third partial region toward the third electrode are aligned with a second direction crossing the first direction. The first partial region is between the fourth partial region and the third partial region in the first direction. The second partial region is between the third partial region and the fifth partial region in the first direction. The second layer includes $Al_{x2}Ga_{1-x2}N$ ($0<x2\leq1$). The second layer includes a first semiconductor region and a second semiconductor region. A direction from the first partial region toward the first semiconductor region and a direction from the second partial region toward the second semiconductor region are aligned with the second direction. The third layer includes $Al_{x3}Ga_{1-x3}N$ ($0<x3\leq1$). The third layer includes first to third intermediate regions. The first intermediate region is provided between the first partial region and the first semiconductor region in the second direction. The second intermediate region is provided between the second partial region and the second semiconductor region in the second direction. The third intermediate region is provided between the third partial region and the third electrode in the second direction. The fourth layer includes $Al_{x4}Ga_{1-x4}N$ ($0\leq x4<1$, $x4<x1$, $x4<x2$, and $x4<x3$). The fourth layer is provided between the first partial region and the first intermediate region, between the second partial region and the second intermediate region, and between the third partial region and the third intermediate region in the second direction. The insulating portion includes a first insulating region provided between the third layer and the third electrode in the second direction. A first concentration of the first element at a first position inside a region including the first intermediate region and the first semiconductor region is higher than a third concentration of the first element at a third position inside the third intermediate region. A direction from the third position toward the first position is aligned with the first direction. The first element includes at least one selected from the group consisting of silicon, oxygen, carbon, and magnesium.

According to another embodiment, a method for manufacturing a semiconductor device is disclosed. The method includes exposing a first portion and a second portion of an $Al_{x1}Ga_{1-x1}N$ film ($0<x1\le1$) of a stacked body. The stacked body includes the $Al_{x1}Ga_{1-x1}N$ film, an $Al_{x4}Ga_{1-x4}N$ film ($0\le x4<1$ and $x4<x1$), and an $Al_{x3}Ga_{1-x3}N$ film ($0<x3\le1$ and $x4<x3$). The $Al_{x4}Ga_{1-x4}N$ film is provided between the $Al_{x1}Ga_{1-x1}N$ film and the $Al_{x3}Ga_{1-x3}N$ film. The exposing is performed by removing a portion of the $Al_{x3}Ga_{1-x3}N$ film and a portion of the $Al_{x4}Ga_{1-x4}N$ film of the stacked body. The method can include performing processing of the first portion and the second portion. The processing includes at least one selected from the group consisting of UV irradiation processing, acid treatment, and alkali treatment. The method can include forming an $Al_{x5}Ga_{1-x5}N$ film ($0\le x5<1$, $x5<x1$, and $x5<x3$) and an $Al_{x2}Ga_{1-x2}N$ film ($0<x2\le1$, $x1<x2$, and $x5<x2$) at the first portion and the second portion having the processing performed. The $Al_{x5}Ga_{1-x5}N$ film is provided between the first portion and the $Al_{x2}Ga_{1-x2}N$ film and between the second portion and the $Al_{x2}Ga_{1-x2}N$ film. The $Al_{x3}Ga_{1-x3}N$ film is provided between the first portion and the second portion. In addition, the method can include forming an insulating portion at the $Al_{x3}Ga_{1-x3}N$ film, and forming an electrode at the insulating portion.

According to another embodiment, a method for manufacturing a semiconductor device is disclosed. The method includes performing processing of a first portion and a second portion of an $Al_{x3}Ga_{1-x3}N$ film ($0<x3\le1$ and $x4<x3$) of a stacked body without performing the processing for a third portion of the $Al_{x3}Ga_{1-x3}N$ film. The stacked body includes an $Al_{x1}Ga_{1-x1}N$ film ($0<x1\le1$), an $Al_{x4}Ga_{1-x4}N$ film ($0\le x4<1$ and $x4<x1$), and the $Al_{x3}Ga_{1-x3}N$ film. The $Al_{x4}Ga_{1-x4}N$ film is provided between the $Al_{x1}Ga_{1-x1}N$ film and the $Al_{x3}Ga_{1-x3}N$ film. The processing includes at least one selected from the group consisting of UV irradiation processing, acid treatment, and alkali treatment. The third portion is between the first portion and the second portion. The method can include forming an $Al_{x2}Ga_{1-x2}N$ film ($0<x2\le1$ and $x1<x2$) at the first portion and the second portion having the processing performed. In addition, the method can include forming an insulating portion at the third portion, and forming an electrode at the insulating portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes first to third electrodes 61 to 63, first to fifth layers 10 to 50, and an insulating portion 80.

The direction from the second electrode 62 toward the first electrode 61 is aligned with a first direction. The first direction is taken as an X-axis direction. One direction perpendicular to the X-axis direction is taken as a Z-axis direction. A direction perpendicular to the X-axis direction and the Z-axis direction is taken as a Y-axis direction.

The position in the first direction (the X-axis direction) of the third electrode 63 is between the position in the first direction of the first electrode 61 and the position in the first direction of the second electrode 62.

The first layer 10 includes $Al_{x1}Ga_{1-x1}N$ ($0<x1\le1$). In one example, the composition ratio x1 is not less than 0.05 and not more than 0.3. The first layer 10 is, for example, an AlGaN layer.

The first layer 10 includes first to fifth partial regions 11 to 15. The direction from the fourth partial region 14 toward the first electrode 61 is aligned with a second direction. The second direction crosses the first direction (the X-axis direction). In the example, the second direction is the Z-axis direction. The direction from the fifth partial region 15 toward the second electrode 62 is aligned with the second direction recited above. The direction from the third partial region 13 toward the third electrode 63 is aligned with the second direction recited above. The first partial region 11 is between the fourth partial region 14 and the third partial region 13 in the first direction (the X-axis direction). The second partial region 12 is between the third partial region 13 and the fifth partial region 15 in the first direction.

The second layer 20 includes $Al_{x2}Ga_{1-x2}N$ ($0<x2\le1$). In one example, the composition ratio x2 is not less than 0.15 and not more than 0.3. The second layer 20 is, for example, an AlGaN layer.

The second layer 20 includes a first semiconductor region 21 and a second semiconductor region 22. The direction from the first partial region 11 toward the first semiconductor region 21 is aligned with the second direction (e.g., the Z-axis direction) recited above. The direction from the second partial region 12 toward the second semiconductor region 22 is aligned with the second direction (e.g., the Z-axis direction).

The third layer 30 includes $Al_{x3}Ga_{1-x3}N$ ($0<x3\le1$). In one example, the composition ratio x3 is not less than 0.03 and not more than 0.2. The third layer 30 is, for example, an AlGaN layer.

The third layer 30 is provided between the third partial region 13 and the third electrode 63 in the second direction (e.g., the Z-axis direction).

The fourth layer 40 includes $Al_{x4}Ga_{1-x4}N$ ($0\le x4<1$, $x4<x1$, $x4<x2$, and $x4<x3$). In one example, the composition ratio x4 is not less than 0 and not more than 0.05. The fourth layer 40 is, for example, a GaN layer.

The fourth layer 40 is provided between the third partial region 13 and the third layer 30 in the second direction (the Z-axis direction).

The fifth layer 50 includes $Al_{x5}Ga_{1-x5}N$ ($0\le x5<1$, $x5<x1$, $x5<x2$, and $x5<x3$). In one example, the composition ratio x5 is not less than 0 and not more than 0.05. The fifth layer 50 is, for example, a GaN layer.

The fifth layer 50 includes a first intermediate region 51 and a second intermediate region 52. The first intermediate region 51 provided between the first partial region 11 and the first semiconductor region 21 in the second direction (e.g., the Z-axis direction). The second intermediate region 52 is provided between the second partial region 12 and the second semiconductor region 22 in the second direction. The third layer 30 is provided between the first intermediate region 51 and the second intermediate region 52 in the first direction (the X-axis direction).

The insulating portion 80 includes a first insulating region 81. The first insulating region 81 is provided between the third layer 30 and the third electrode 63 in the second direction (e.g., the Z-axis direction).

A substrate 5s is further provided in the example. The substrate 5s is, for example, a silicon substrate. The substrate 5s may be, for example, a sapphire substrate. A buffer layer may be provided on the substrate 5s. The buffer layer may include a stacked member including multiple films having mutually-different compositions.

The first layer 10 is provided on the substrate 5s (or on the buffer layer). The fourth layer 40 and the third layer 30 are provided in this order on a portion (the gate portion) of the first layer 10. The fifth layer 50 and the second layer 20 are provided in this order on other portions (the source portion and the drain portion) of the first layer 10. The first to third electrodes 61 to 63 are provided on the layer including these semiconductors.

For example, the first electrode 61 functions as a drain electrode. For example, the second electrode 62 functions as a source electrode. For example, the third electrode 63 functions as a gate electrode. The first insulating region 81 functions as at least a portion of a gate insulating film. The semiconductor device 110 is, for example, a HEMT (high-electron mobility transistor).

For example, the current that flows between the first electrode 61 and the second electrode 62 is controlled by the potential (the voltage) of the third electrode 63.

For example, carriers CR are generated in a region of the first intermediate region 51 on the first semiconductor region 21 side. For example, the carriers CR are generated in a region of the second intermediate region 52 on the second semiconductor region 22 side. These carriers CR are, for example, a two-dimensional electron gas (2DEG). For example, the carriers CR may be generated in a region of the fourth layer 40 on the third layer 30 side according to the potential of the third electrode 63.

As described above, the third layer 30 is provided between the first intermediate region 51 and the second intermediate region 52 in the first direction (the X-axis direction). For example, the thickness of the fourth layer 40 is thinner than the thickness of the fifth layer 50. For example, the thickness along the second direction (e.g., the Z-axis direction) of the fourth layer 40 is taken as a thickness t40. The thickness along the second direction of the first intermediate region 51 is taken as a thickness t51. The thickness along the second direction of the second intermediate region 52 is taken as a thickness t52. The thickness t40 is thinner than the thickness t51 and thinner than the thickness t52.

Thereby, for example, the carriers CR are generated less easily in the portion (the fourth layer 40) overlapping the third electrode 63 than in the first intermediate region 51 and the second intermediate region 52. The threshold voltage is higher because the thickness t40 is thin. For example, the semiconductor device 110 may perform, for example, a normally-OFF operation.

In the embodiment, a first concentration of a designated element (a first element) at a first position p1 inside the first partial region 11 is higher than a third concentration of the first element recited above at a third position p3 inside the third partial region 13. The direction from the third position p3 toward the first position p1 is aligned with the first direction (the X-axis direction).

In the embodiment, a second concentration of the first element recited above at a second position p2 inside the second partial region 12 may be higher than the third concentration of the first element recited above at the third position p3 inside the third partial region 13. The direction from the second position p2 toward the first position p1 is aligned with the first direction (the X-axis direction). The third position p3 is between the first position p1 and the second position p2 in the first direction (the X-axis direction).

The first element includes, for example, at least one selected from the group consisting of silicon, oxygen, carbon, and magnesium. In one example, the first element is silicon.

In the embodiment, for example, as recited above, the third layer 30 is provided between the first intermediate region 51 and the second intermediate region 52 in the first direction (the X-axis direction). In the embodiment, the thickness t40 is thinner than the thickness t51 and thinner than the thickness t52. In one example for obtaining such a configuration, the fourth layer 40 and the fifth layer 50 are formed separately from each other. In such a case, the crystallinity of the fifth layer 50 is improved by including the designated first element (e.g., silicon) in the region used as the foundation of the fifth layer 50 when forming the fifth layer 50. It is considered that this is because dislocations are bent by the first element, and the dislocation density decreases in the fifth layer 50 above the first position p1 and the second position p2.

High crystallinity is obtained in the second layer 20 because the crystallinity of the fifth layer 50 is high. For example, a large ON-current is obtained by the high crystallinity. For example, a low ON-resistance is obtained. In the embodiment, the characteristics can be improved.

On the other hand, in another example for obtaining the configuration in which the thickness t40 is thinner than the thickness t51 and thinner than the thickness t52, a method for obtaining the fourth layer 40 may be considered in which a layer that is used to form the fourth layer 40 and the fifth layer 50 is formed; and a portion of the layer is removed. In such a case, for example, impurities adhere easily to the surface when removing the portion of the layer. The impurities are positioned at a portion corresponding to the third electrode 63 functioning as the gate electrode. In such a case, the characteristics of the semiconductor device become unstable.

In the embodiment, the first concentration is, for example, not less than $1 \times 10^{18}/cm^3$ and not more than $1 \times 10^{19}/cm^3$. The second concentration is, for example, not less than $1 \times 10^{18}/cm^3$ and not more than $1 \times 10^{19}/cm^3$. For example, the third concentration is less than $1 \times 10^{18}/cm^3$. For example, the third concentration may be less than $5 \times 10^{17}/cm^3$.

In the embodiment, it is more favorable for the first element recited above to be electrically inert. For example, it is favorable for at least a portion of the multiple first elements at the first position p1 to be electrically inert. For example, it is favorable for at least a portion of the multiple first elements at the second position p2 to be electrically inert.

Thereby, for example, the characteristics are stabilized. In the case where the carrier density at the first position p1 is excessively high, for example, the current-voltage characteristic changes easily when a voltage is applied between the third electrode 63 and the first electrode 61. For example, current collapse occurs easily.

In the embodiment, for example, the fluctuation of the characteristics can be suppressed by reducing the carrier concentration at the first position p1. For example, the current collapse can be suppressed. For example, the breakdown voltage can be increased.

For example, in one example, the carrier concentration at the first position p1 is less than $1\times10^{18}/cm^3$. In such a case, the carrier concentration at the second position p2 is less than $1\times10^{18}/cm^3$.

For example, in another example, the carrier concentration at the first position p1 is less than $1\times10^{17}/cm^3$. In such a case, the carrier concentration at the second position p2 is less than $1\times10^{17}/cm^3$.

Examples of the concentration of the first element recited above and the carrier concentration recited above are described below.

In the embodiment, the concentration of the first element at the first position p1 inside the first partial region 11 is high locally. For example, the concentration of the first element at a fourth position p4 inside the first partial region 11 is lower than the first concentration at the first position p1. The first position p1 is positioned between the fourth position p4 and the first intermediate region 51. For example, the concentration of the first element at the fourth position p4 may be substantially the same as the third concentration.

For example, as shown in FIG. 1, the concentration of the first element is high locally in a first region r1. The first position p1 is included in the first region r1. The thickness along the Z-axis direction of the first region r1 is, for example, 15 nm or less. The thickness of the first region r1 may be, for example, 0.4 nm (e.g., about 1 atomic layer thick) or more.

The concentration of the first element at the second position p2 inside the second partial region 12 is high locally. For example, the concentration of the first element at a fifth position p5 inside the second partial region 12 is lower than the second concentration at the second position p2. The second position p2 is positioned between the fifth position p5 and the second intermediate region 52. For example, the concentration of the first element at the fifth position p5 may be substantially the same as the third concentration.

Examples of the concentration of the first element recited above and the carrier concentration recited above are described below.

In the example as shown in FIG. 1, the first layer 10 further includes a sixth partial region 16 and a seventh partial region 17. On the other hand, the fourth layer 40 includes a first portion 41 and a second portion 42. The second portion 42 is provided between the first portion 41 and the third partial region 13. The first portion 41 is between the first intermediate region 51 and the second intermediate region 52 in the first direction (the X-axis direction). The second portion 42 is between the sixth partial region 16 and the seventh partial region 17 in the first direction.

The first position p1 is between the first partial region 11 and the sixth partial region 16 in the second direction (e.g., the Z-axis direction). The second position p2 is between the second partial region 12 and the seventh partial region 17 in the second direction.

For example, the sixth partial region 16 and the seventh partial region 17 are regrown AlGaN layers, etc. The fifth layer 50 (the first intermediate region 51 and the second intermediate region 52) is a regrown GaN layer, etc. The second layer 20 (the first semiconductor region 21 and the second semiconductor region 22) is a regrown AlGaN layer, etc.

For example, the first position p1 substantially corresponds to the regrown interface between the first partial region 11 of the first layer 10 and the regrown sixth partial region 16. For example, the second position p2 substantially corresponds to the regrown interface between the second partial region 12 of the first layer 10 and the regrown seventh partial region 17.

In the example, the regrown interface is positioned lower than the upper surface of the third partial region 13 of the first layer 10. For example, at least a portion of the third partial region 13 is between the sixth partial region 16 and the seventh partial region 17 in the first direction (the X-axis direction).

In the example shown in FIG. 1, at least a portion of the third electrode 63 is between the first semiconductor region 21 and the second semiconductor region 22 in the first direction (the X-axis direction). The third electrode 63 is, for example, a recessed gate electrode.

The insulating portion 80 may further include a second insulating region 82 and a third insulating region 83 in addition to the first insulating region 81 (referring to FIG. 1). The first semiconductor region 21 is provided between the second insulating region 82 and the first intermediate region 51 in the second direction (e.g., the Z-axis direction). The second semiconductor region 22 is provided between the third insulating region 83 and the second intermediate region 52 in the second direction.

The insulating portion 80 may further include a fourth insulating region 84 and a fifth insulating region 85. The fourth insulating region 84 is provided between the first semiconductor region 21 and at least a portion of the third electrode 63 in the first direction (the X-axis direction). The fifth insulating region 85 is provided between the second semiconductor region 22 and at least a portion of the third electrode 63 in the first direction.

In the example shown in FIG. 1, the third electrode 63 includes first to third electrode regions 63a to 63c. The fourth insulating region 84 is between the first electrode region 63a and a portion of the third layer 30 in the second direction (e.g., the Z-axis direction). The fifth insulating region 85 is between the second electrode region 63b and another portion of the third layer 30 in the second direction. The position of the third electrode region 63c in the first direction (the X-axis direction) is between the position of the first electrode region 63a in the first direction and the position of the second electrode region 63b in the first direction.

Examples of the concentration of the first element and the carrier concentration will now be described. The first element is silicon in the following examples.

FIG. 2A, FIG. 2B, FIG. 3A, and FIG. 3B are graphs illustrating the semiconductor device according to the first embodiment.

Figure 2A:
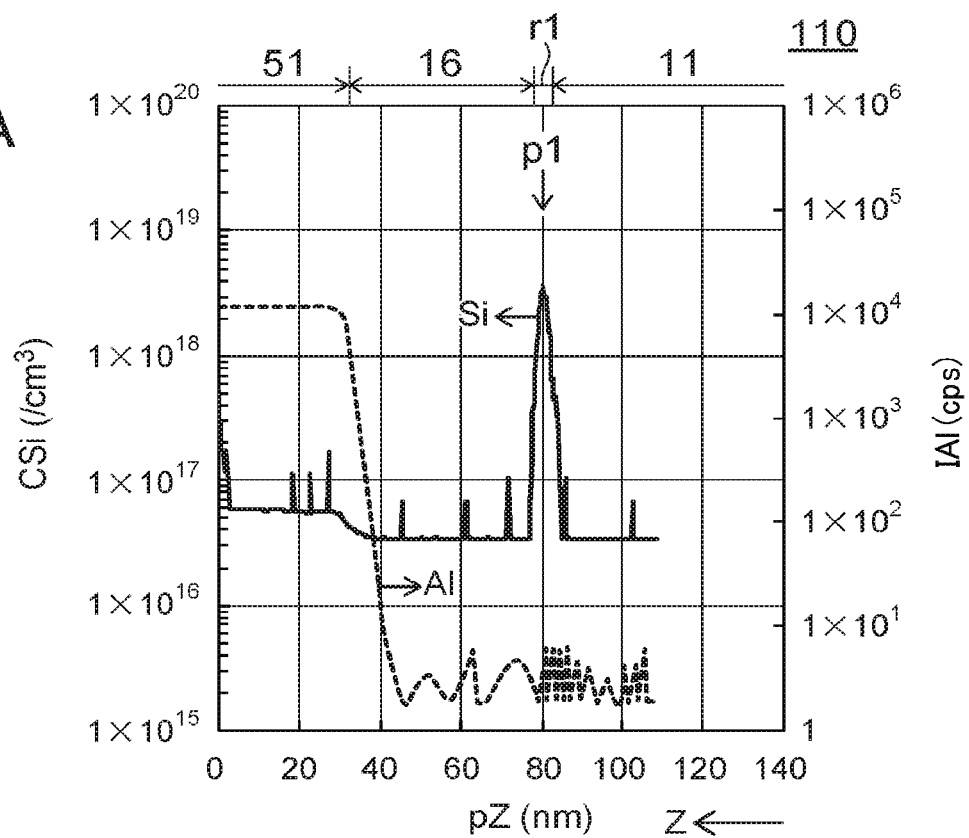
FIG. 2A and FIG. 2B are graphs illustrating the semiconductor device according to the first embodiment.
Figure 2B:
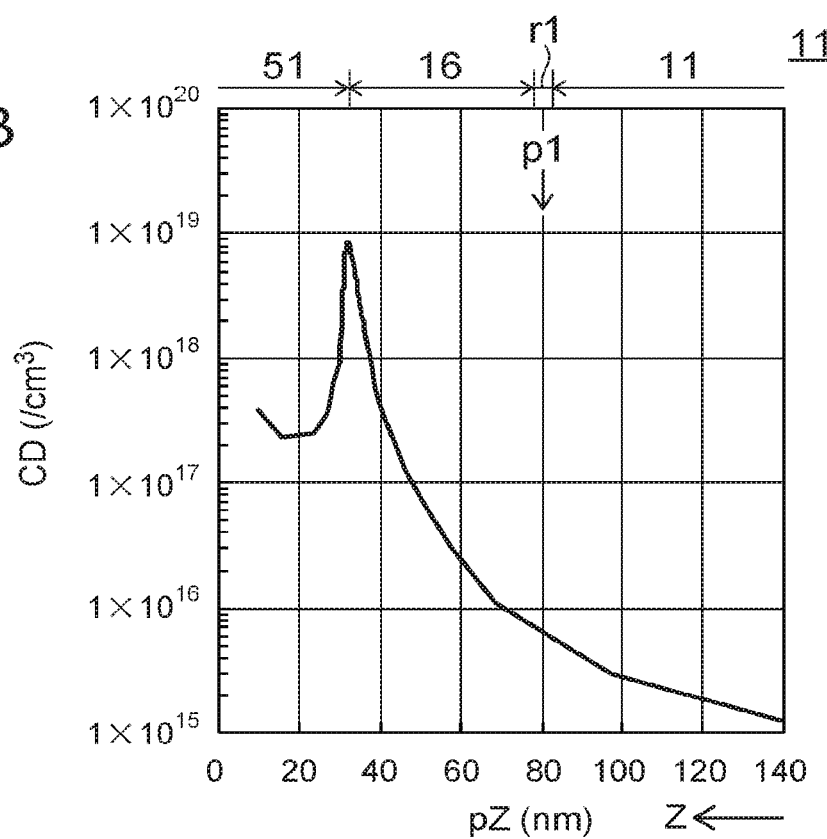
Figure 3A:
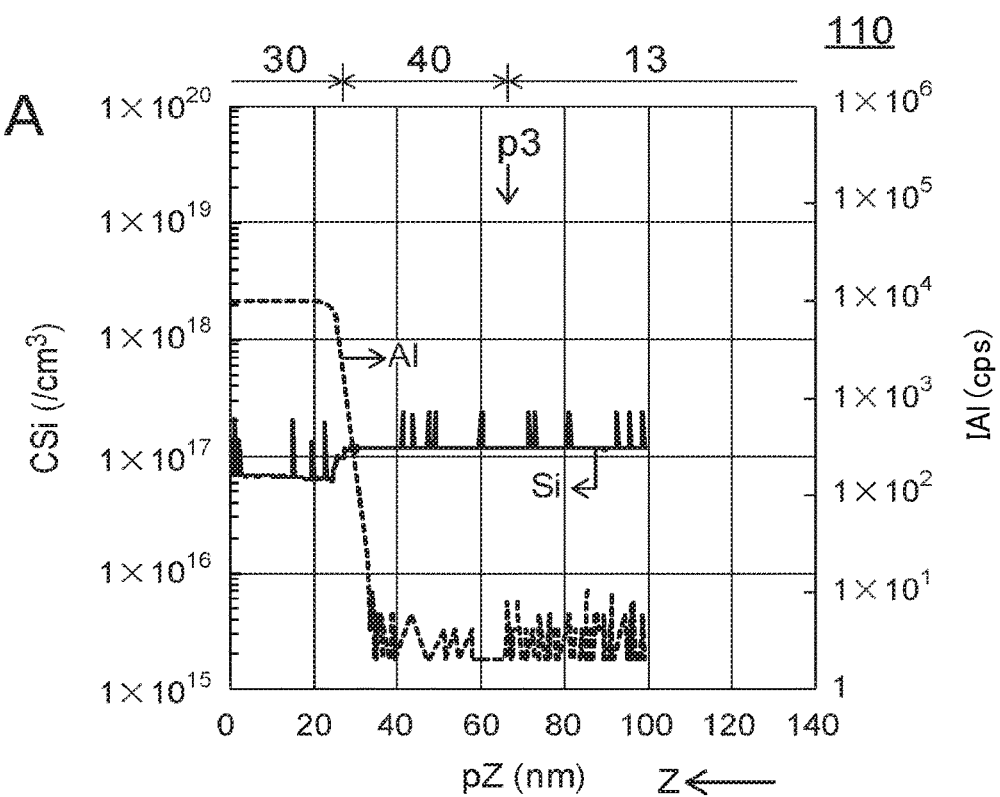
FIG. 3A and FIG. 3B are graphs illustrating the semiconductor device according to the first embodiment.
Figure 3B:
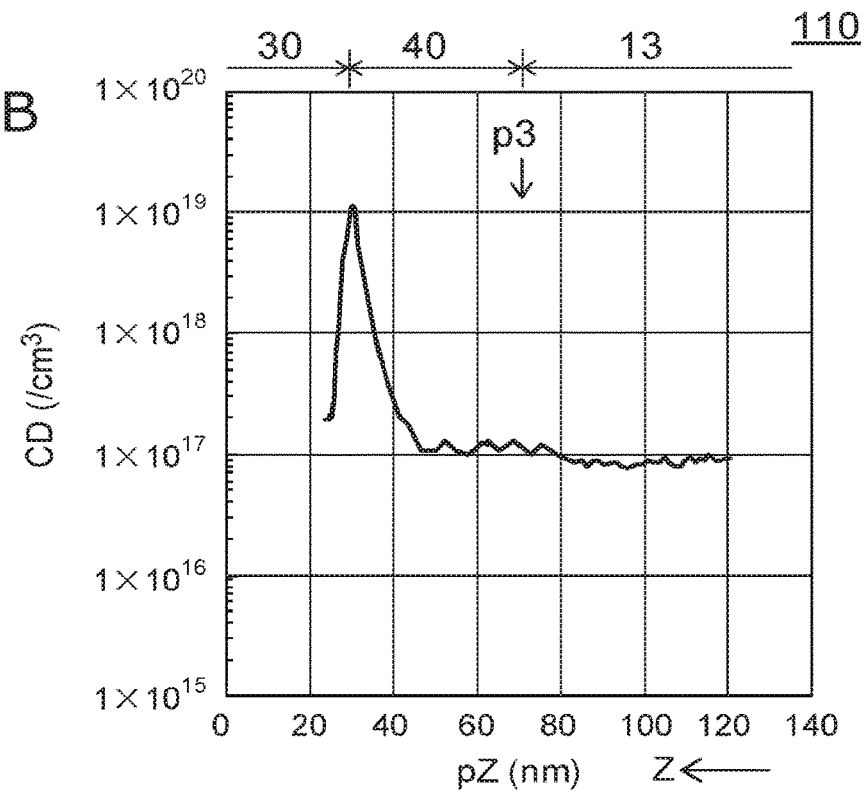

FIG. 2A corresponds to the profiles of the elements along the Z-axis direction in a region including the first position p1. FIG. 2B corresponds to the profile of the carrier concentration along the Z-axis direction in the region including the first position p1. FIG. 3A corresponds to the profiles of the elements along the Z-axis direction in a region including the third position p3. FIG. 3B corresponds to the profile of the carrier concentration along the Z-axis direction in the region including the third position p3. In these figures, the horizontal axis is a position pZ (nm) in the Z-axis direction.

In FIG. 2A and FIG. 3A, the vertical axis on the left side corresponds to a concentration CSi (/cm$^3$) of silicon. In FIG. 2A and FIG. 3A, the vertical axis on the right side corresponds to a detection intensity IAl (cps (counts per sec)) of aluminum. In FIG. 2B and FIG. 3B, the vertical axis corresponds to a carrier concentration CD (/cm$^3$).

As shown in FIG. 2A, the concentration CSi of silicon has a peak at the position pZ of about 80 nm. This position corresponds to the first position p1. The first position p1 is included in the first region r1 between the first partial region 11 and the sixth partial region 16. The concentration (the peak) of first atoms (silicon) at the first position p1 is about $2 \times 10^{18}$/cm$^3$. Thus, the first concentration is, for example, not less than $1 \times 10^{18}$/cm$^3$ and not more than $1 \times 10^{19}$/cm$^3$.

As shown in FIG. 3A, a peak of silicon is not observed in the region including the third partial region 13 and the fourth layer 40. The concentration of the first atoms (silicon) at the third position p3 is about $1.5 \times 10^{17}$/cm$^3$. Thus, the third concentration is less than $1 \times 10^{18}$/cm$^3$. For example, the third concentration is less than $5 \times 10^{17}$/cm$^3$.

On the other hand, as shown in FIG. 2B, the carrier concentration CD at the first position p1 is about $5 \times 10^{15}$/cm$^3$.

Thus, the carrier concentration at the first position p1 is less than $1 \times 10^{18}$/cm$^3$. The carrier concentration at the first position p1 may be less than $1 \times 10^{17}$/cm$^3$.

As shown in FIG. 3B, the carrier concentration CD is about $1 \times 10^{17}$/cm$^3$ in the region including the third partial region 13 and the fourth layer 40. The carrier concentration CD at the third position p3 is less than $1 \times 10^{18}$/cm$^3$.

Thus, the concentration (the first concentration) of the first element at the first position p1 is high. Thereby, good crystallinity is obtained. The carrier concentration CD at the first position p1 is low. Thereby, for example, the characteristics are more stable.

The first position p1 may be the position where a maximum value of the concentration of the first element (silicon) is obtained. The carrier concentration CD at the first position p1 is, for example, not more than 1/10 of the concentration (the first concentration) of the first element at the first position p1.

An example of a method for manufacturing the semiconductor device 110 will now be described.

FIG. 4A to FIG. 4D are schematic cross-sectional views in order of the processes, illustrating the method for manufacturing the semiconductor device according to the first embodiment.

Figure 4A:
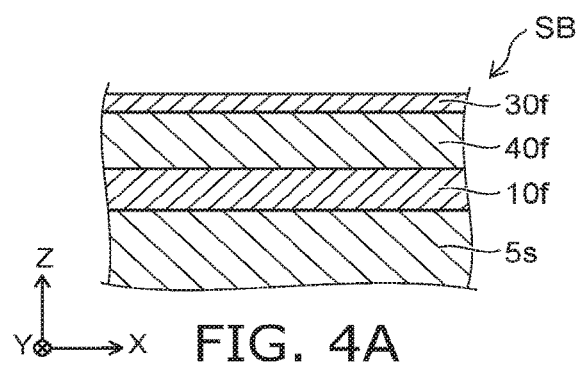
FIG. 4A to FIG. 4D are schematic cross-sectional views in order of the processes, illustrating a method for manufacturing the semiconductor device according to the first embodiment.

A stacked body SB is prepared as shown in FIG. 4A. The stacked body SB includes an $Al_{x1}Ga_{1-x1}N$ film 10$f$ (0<x1≤1), an $Al_{x4}Ga_{1-x4}N$ film 40$f$ (0≤x4<1 and x4<x1), and an $Al_{x3}Ga_{1-x3}N$ film 30$f$ (0<x3≤1 and x4<x3). The $Al_{x4}Ga_{1-x4}N$ film 40$f$ is provided between the $Al_{x1}Ga_{1-x1}N$ film 10$f$ and the $Al_{x3}Ga_{1-x3}N$ film 30$f$. In the example, the $Al_{x1}Ga_{1-x1}N$ film 10$f$, the $Al_{x4}Ga_{1-x4}N$ film 40$f$, and the $Al_{x3}Ga_{1-x3}N$ film 30$f$ are provided in this order on the substrate 5$s$.

Figure 4B:
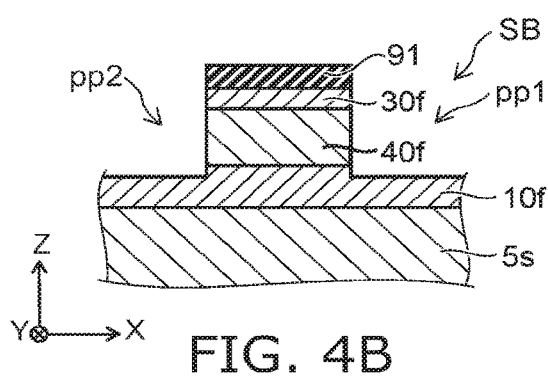

As shown in FIG. 4B, a first portion pp1 and a second portion pp2 of the $Al_{x1}Ga_{1-x1}N$ film 10$f$ are exposed by removing a portion of the $Al_{x3}Ga_{1-x3}N$ film 30$f$ and a portion of the $Al_{x4}Ga_{1-x4}N$ film 40$f$ of the stacked body SB. In the example, a mask 91 is provided at a portion of the stacked body SB. The portions that are not covered with the mask 91 are removed. For example, the removal is performed by RIE (Reactive Ion Etching), etc.

The first element (e.g., silicon) is caused to adhere to the first portion pp1 and the second portion pp2 (the surface portions). For example, silicon in an atmosphere may be caused to adhere to these surface portions. A gas that includes silicon may be caused to contact these surface portions.

Figure 4C:
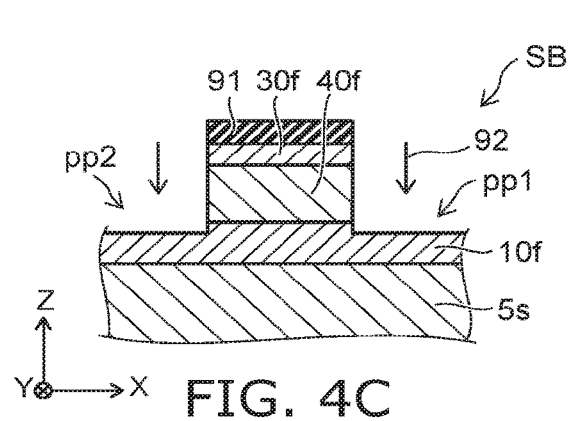

As shown in FIG. 4C, for example, processing 92 of the first portion pp1 and the second portion pp2 is performed. The processing 92 includes, for example, at least one selected from the group consisting of UV irradiation processing, acid treatment, and alkali treatment. For example, by performing the processing 92 of the surface portions (the first portion pp1 and the second portion pp2) to which the first element (silicon) is adhered, the first element is caused to be inert.

Figure 4D:
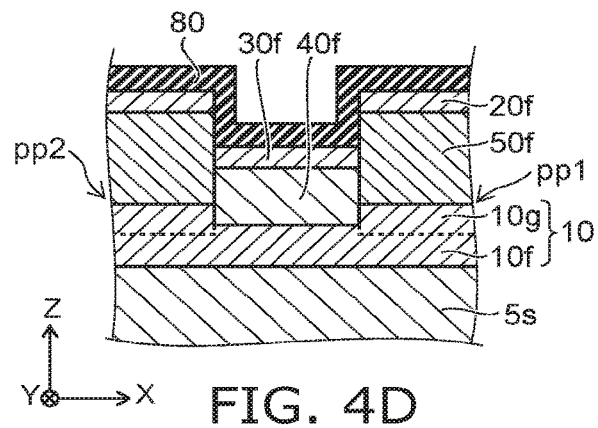

As shown in FIG. 4D, an $Al_{x5}Ga_{1-x5}N$ film 50$f$ (0≤x5<1, x5<x1, and x5<x3) and an $Al_{x2}Ga_{1-x2}N$ film 20$f$ (0<x2≤1, x1<x2, and x5<x2) are formed at the first portion pp1 and the second portion pp2 having the processing 92 performed. In the example, the $Al_{x5}Ga_{1-x5}N$ film 50$f$ and the $Al_{x2}Ga_{1-x2}N$ film 20$f$ are formed after forming an $Al_{x1}Ga_{1-x1}N$ film 10$g$ (0<x1≤1). The $Al_{x1}Ga_{1-x1}N$ film 10$g$ is used to form the sixth partial region 16 and the seventh partial region 17. The $Al_{x5}Ga_{1-x5}N$ film 50$f$ is provided between the first portion pp1 and the $Al_{x2}Ga_{1-x2}N$ film 20$f$ and between the second portion pp2 and the $Al_{x2}Ga_{1-x2}N$ film 20$f$. The $Al_{x3}Ga_{1-x3}N$ film 30$f$ is provided between the first portion pp1 and the second portion pp2. Subsequently, the mask 91 is removed as necessary.

As shown in FIG. 4D, the insulating portion 80 is formed at the $Al_{x3}Ga_{1-x3}N$ film 30$f$.

Subsequently, an electrode (e.g., the third electrode 63 (referring to FIG. 1)) is formed at the insulating portion 80. At this time, the first electrode 61 may be formed at the portion of the $Al_{x2}Ga_{1-x2}N$ film 20$f$ corresponding to the first portion pp1; and the second electrode 62 may be formed at the portion of the $Al_{x2}Ga_{1-x2}N$ film 20$f$ corresponding to the second portion pp2. Thus, the semiconductor device 110 is obtained.

Figure 5:
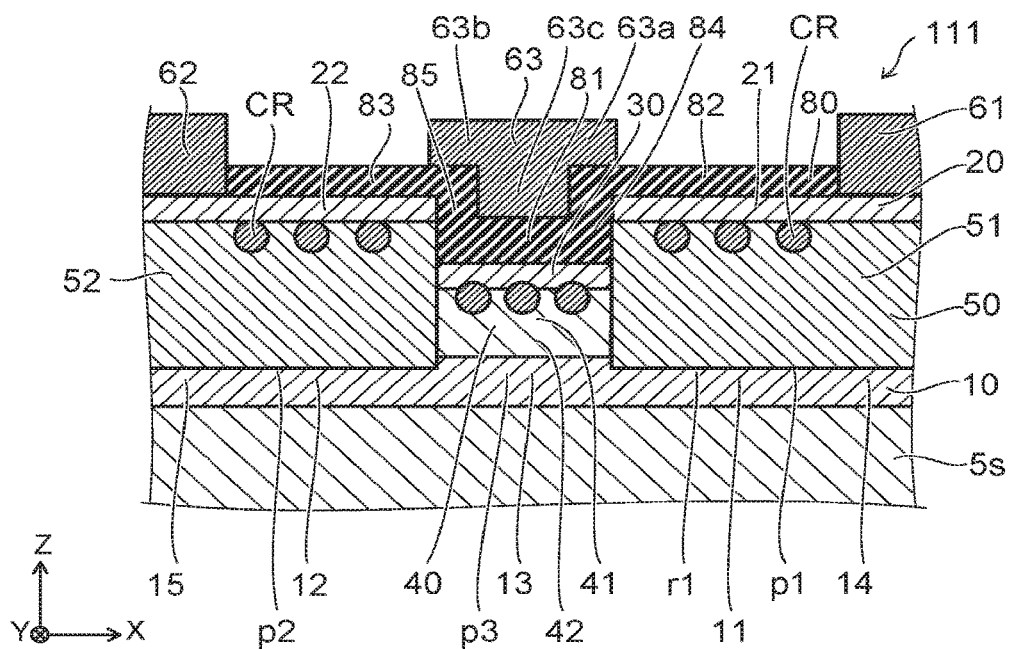
FIG. 5 is a schematic cross-sectional view illustrating a semiconductor device according to the first embodiment.

FIG. 5 is a schematic cross-sectional view illustrating a semiconductor device according to the first embodiment.

As shown in FIG. 5, the first to third electrodes 61 to 63, the first to fifth layers 10 to 50, and the insulating portion 80 are provided in the semiconductor device 111 as well. In the semiconductor device 111, the sixth partial region 16 and the seventh partial region 17 are not provided in the first layer 10 (referring to FIG. 1). Otherwise, the configuration of the semiconductor device 111 is the same as the configuration of the semiconductor device 110.

In the semiconductor device 111, the first position p1 corresponds to the interface between the first layer 10 (the first partial region 11) and the fifth layer 50 (the first intermediate region 51). The second position p2 corresponds to the interface between the first layer 10 (the second partial region 12) and the fifth layer 50 (the second intermediate region 52). These interfaces are, for example, regrown interfaces.

In the semiconductor device 111 as well, high crystallinity is obtained. For example, a large ON-current is obtained. For example, a low ON-resistance is obtained. For example, the characteristics can be improved. In the semiconductor device 111 as well, the carrier concentration CD at the first position p1 may be low. Thereby, for example, the current collapse can be suppressed. For example, more stable characteristics are obtained.

Second Embodiment

Figure 6:
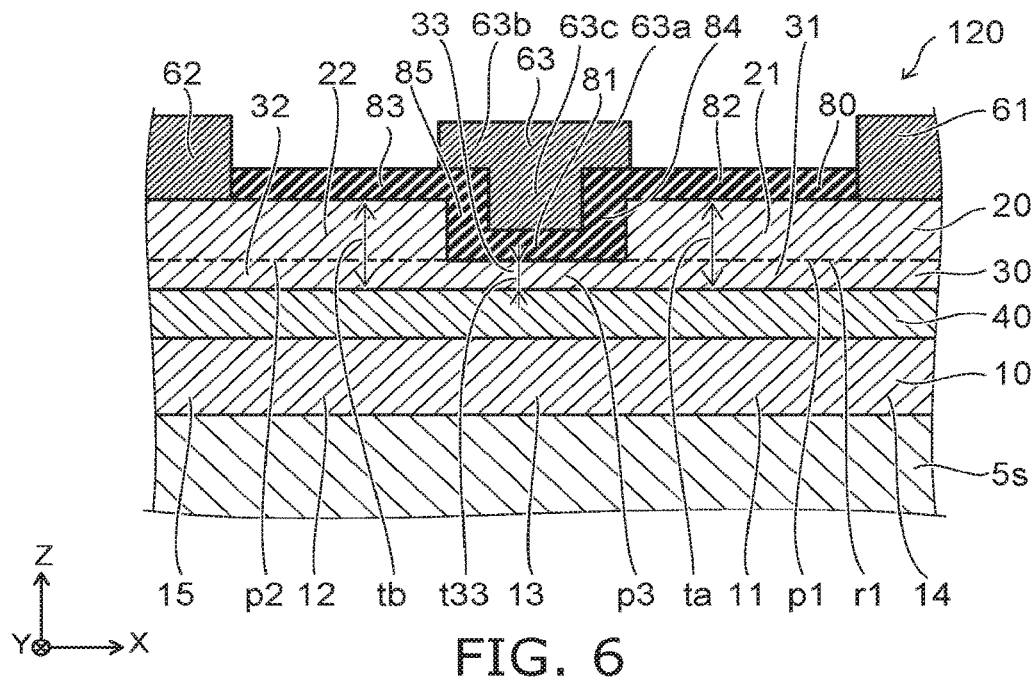
FIG. 6 is a schematic cross-sectional view illustrating a semiconductor device according to a second embodiment.

FIG. 6 is a schematic cross-sectional view illustrating a semiconductor device according to a second embodiment.

As shown in FIG. 6, the semiconductor device 120 according to the embodiment includes the first to third electrodes 61 to 63, the first to fourth layers 10 to 40, and the insulating portion 80.

The direction from the second electrode 62 toward the first electrode 61 is aligned with the first direction (the X-axis direction). In such a case as well, the position in the first direction of the third electrode 63 is between the position in the first direction of the first electrode 61 and the position in the first direction of the second electrode 62.

In the example as well, the first layer 10 includes $Al_{x1}Ga_{1-x1}N$ ($0<x1\le1$). The first layer 10 includes the first to fifth partial regions 11 to 15. The direction from the fourth partial region 14 toward the first electrode 61, the direction from the fifth partial region 15 toward the second electrode 62, and the direction from the third partial region 13 toward the third electrode 63 are aligned with the second direction. The second direction crosses the first direction. The second direction is, for example, the Z-axis direction. The first partial region 11 is between the fourth partial region 14 and the third partial region 13 in the first direction. The second partial region 12 is between the third partial region 13 and the fifth partial region in the first direction. The first layer 10 is, for example, an AlGaN layer.

The second layer 20 includes $Al_{x2}Ga_{1-x2}N$ ($0<x2\le1$). The second layer 20 includes the first semiconductor region 21 and the second semiconductor region 22. The direction from the first partial region 11 toward the first semiconductor region 21 and the direction from the second partial region 12 toward the second semiconductor region 22 are aligned with the second direction (the Z-axis direction). The second layer 20 is, for example, an AlGaN layer.

The third layer 30 includes $Al_{x3}Ga_{1-x3}N$ ($0<x3\le1$). The third layer 30 includes first to third intermediate regions 31 to 33. The first intermediate region 31 is provided between the first partial region 11 and the first semiconductor region 21 in the second direction (the Z-axis direction). The second intermediate region 32 is provided between the second partial region 12 and the second semiconductor region 22 in the second direction. The third intermediate region 33 is provided between the third partial region 13 and the third electrode 63 in the second direction (the Z-axis direction). The third layer 30 is, for example, an AlGaN layer.

The fourth layer 40 includes $Al_{x4}Ga_{1-x4}N$ ($0\le x4<1$, $x4<x1$, $x4<x2$, and $x4<x3$). The fourth layer 40 is provided between the first partial region 11 and the first intermediate region 31, between the second partial region 12 and the second intermediate region 32, and between the third partial region 13 and the third intermediate region 33 in the second direction (the Z-axis direction). The fourth layer 40 is, for example, a GaN layer.

The insulating portion 80 includes the first insulating region 81. The first insulating region 81 is provided between the third layer 30 (the third intermediate region 33) and the third electrode 63 in the second direction (the Z-axis direction).

In the semiconductor device 120, the first concentration of the first element at the first position p1 is higher than the third concentration of the first element at the third position p3. The first position p1 is one position inside a region including the first intermediate region 31 and the first semiconductor region 21. The third position p3 is one position inside the third intermediate region 33. The direction from the third position p3 toward the first position p1 is aligned with the first direction (the X-axis direction). The first element includes at least one selected from the group consisting of silicon, oxygen, carbon, and magnesium. The first element is, for example, silicon.

In the semiconductor device 120, the second concentration of the first element recited above at the second position p2 may be higher than the third concentration of the first element at the third position p3. The second position p2 is one position inside a region including the second intermediate region 32 and the second semiconductor region 22. The direction from the second position p2 toward the first position p1 is aligned with the first direction (the X-axis direction). The third position p3 is between the first position p1 and the second position p2 in the first direction (the X-axis direction).

In the example, for example, the first semiconductor region 21 and the second semiconductor region 22 of the second layer 20 are provided respectively at the first intermediate region 31 and the second intermediate region 32 of the third layer 30. The second layer 20 is, for example, a regrowth layer. By providing the first element at the first position p1 of the foundation (the interface) of the regrowth layer, for example, the crystallinity of the first semiconductor region 21 improves. For example, a large ON-current is obtained. For example, a low ON-resistance is obtained. In the embodiment, the characteristics can be improved.

In the semiconductor device 120, the first concentration is, for example, not less than $1\times10^{18}/cm^3$ and not more than $1\times10^{19}/cm^3$. The second concentration is, for example, not less than $1\times10^{18}/cm^3$ and not more than $1\times10^{19}/cm^3$. For example, the third concentration is less than $1\times10^{18}/cm^3$. For example, the third concentration may be less than $5\times10^{17}/cm^3$.

In the semiconductor device 120 as well, it is more favorable for the first element recited above to be electrically inert. For example, current collapse occurs easily. In one example, the carrier concentration at the first position p1 is less than $1\times10^{18}/cm^3$. In such a case, the carrier concentration at the second position p2 is less than $1\times10^{18}/cm^3$. In another example, the carrier concentration at the first position p1 is less than $1\times10^{17}/cm^3$. In such a case, the carrier concentration at the second position p2 is less than $1\times10^{17}/cm^3$.

The profile of the first element and the carrier concentration of the semiconductor device 120 may be similar to those of the semiconductor device 110.

The first position p1 is a position where the concentration of the first element is high locally. For example, the first position p1 is provided in the first region r1 (referring to FIG. 6). The thickness along the Z-axis direction of the first region r1 is, for example, 15 nm or less. The thickness of the first region r1 may be, for example, 0.4 nm (e.g., about 1 atomic layer thick) or more.

The first position p1 may be the position where a maximum value of the concentration of the first element (silicon) is obtained. The carrier concentration CD at the first position p1 is, for example, not more than 1/10 of the concentration (the first concentration) of the first element at the first position p1.

The thickness along the second direction (e.g., the Z-axis direction) of the third intermediate region 33 is taken as a thickness t33. The sum of the thickness along the second direction of the first intermediate region 31 and the thickness along the second direction of the first semiconductor region 21 is taken as a thickness ta. The sum of the thickness along the second direction of the second intermediate region 32 and the thickness along the second direction of the second semiconductor region 22 is taken as a thickness tb. The thickness t33 is thinner than the thickness ta and thinner than the thickness tb. Thereby, a high threshold is obtained.

For example, the semiconductor device 120 performs a normally-OFF operation.

At least a portion of the third electrode 63 is between the first semiconductor region 21 and the second semiconductor region 22 in the first direction (the X-axis direction). For example, the third electrode 63 is a recessed gate electrode.

In the semiconductor device 120, the insulating portion 80 may further include the second insulating region 82 and the third insulating region 83 in addition to the first insulating region 81. The first semiconductor region 21 is provided between the second insulating region 82 and the first intermediate region 31 in the second direction (e.g., the Z-axis direction). The second semiconductor region 22 is provided between the third insulating region 83 and the second intermediate region 32 in the second direction.

The insulating portion 80 may further include the fourth insulating region 84 and the fifth insulating region 85. The fourth insulating region 84 is provided between at least a portion of the third electrode 63 and the first semiconductor region 21 in the first direction (the X-axis direction). The fifth insulating region 85 is provided between at least a portion of the third electrode 63 and the second semiconductor region 22 in the first direction.

In the example shown in FIG. 6, the third electrode 63 includes the first to third electrode regions 63a to 63c. The fourth insulating region 84 is between the first electrode region 63a and a portion of the third layer 30 (the third intermediate region 33) in the second direction (e.g., the Z-axis direction). The fifth insulating region 85 is between the second electrode region 63b and another portion of the third layer 30 (the third intermediate region 33) in the second direction.

An example of a method for manufacturing the semiconductor device 120 will now be described.

FIG. 7A to FIG. 7D are schematic cross-sectional views in order of the processes, illustrating the method for manufacturing the semiconductor device according to the first embodiment.

Figure 7A:
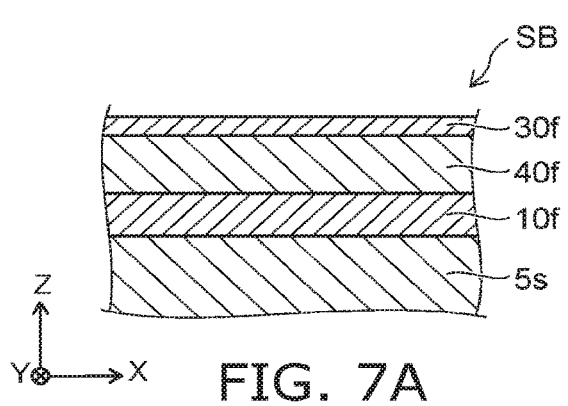
FIG. 7A to FIG. 7D are schematic cross-sectional views in order of the processes, illustrating the method for manufacturing the semiconductor device according to the first embodiment.

The stacked body SB is prepared as shown in FIG. 7A. The stacked body SB includes the $Al_{x1}Ga_{1-x1}N$ film 10f ($0<x1\leq 1$), the $Al_{x4}Ga_{1-x4}N$ film 40f ($0\leq x4<1$ and $x4<x1$), and the $Al_{x3}Ga_{1-x3}N$ film 30f ($0<x3\leq 1$ and $x4<x3$). The $Al_{x4}Ga_{1-x4}N$ film 40f is provided between the $Al_{x1}Ga_{1-x1}N$ film 10f and the $Al_{x3}Ga_{1-x3}N$ film 30f. In the example, the $Al_{x1}Ga_{1-x1}N$ film 10f, the $Al_{x4}Ga_{1-x4}N$ film 40f, and the $Al_{x3}Ga_{1-x3}N$ film 30f are provided in this order on the substrate 5s.

The first element (e.g., silicon) is caused to adhere to the surface of the $Al_{x3}Ga_{1-x3}N$ film 30f. For example, silicon in an atmosphere may be caused to adhere to the surface of the $Al_{x3}Ga_{1-x3}N$ film 30f. A gas that includes silicon may be caused to contact the surface of the $Al_{x3}Ga_{1-x3}N$ film 30f.

Figure 7B:
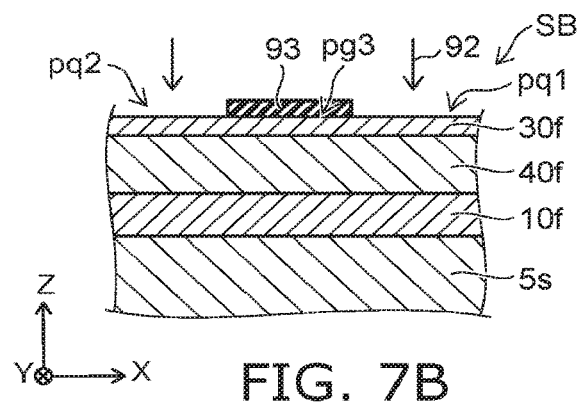

As shown in FIG. 7B, the processing 92 of a first portion pq1 and a second portion pq2 of the $Al_{x3}Ga_{1-x3}N$ film 30f of the stacked body SB is performed. The processing 92 includes at least one selected from the group consisting of UV irradiation processing, acid treatment, and alkali treatment. At this time, the processing 92 recited above is not performed for a third portion pq3 of the $Al_{x3}Ga_{1-x3}N$ film 30f. The third portion pq3 is between the first portion pq1 and the second portion pq2. In the example, a mask 93 is provided at the third portion pq3 of the $Al_{x3}Ga_{1-x3}N$ film 30f. The mask 93 does not cover the first portion pq1 or the second portion pq2 of the $Al_{x3}Ga_{1-x3}N$ film 30f. The processing 92 is performed selectively for the first portion pq1 and the second portion pq2.

Figure 7C:
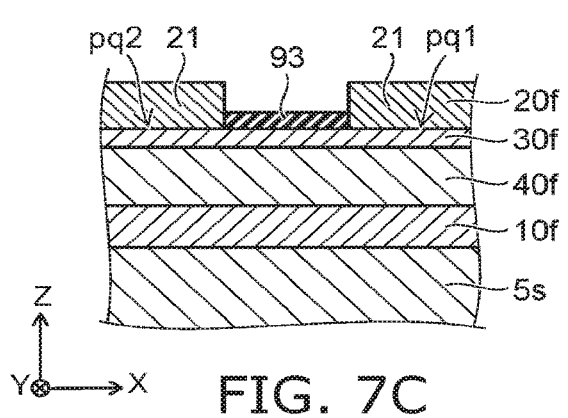

As shown in FIG. 7C, the $Al_{x2}Ga_{1-x2}N$ film 20f ($0<x2\leq 1$ and $x1<x2$) is formed at the first portion pq1 and the second portion pq2 having the processing 92 recited above performed. Subsequently, the mask 93 may be removed as necessary.

Figure 7D:
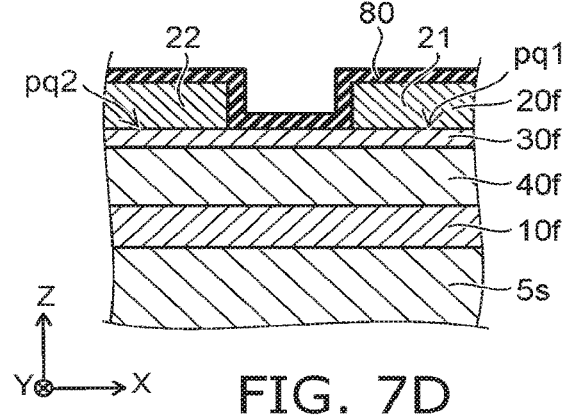

As shown in FIG. 7D, the insulating portion 80 is formed at the third portion pq3. Subsequently, an electrode (e.g., the third electrode 63 (referring to FIG. 6)) is formed at the insulating portion 80. At this time, the first electrode 61 may be formed at the portion of the $Al_{x2}Ga_{1-x2}N$ film 20f corresponding to the first portion pq1; and the second electrode 62 may be formed at the portion of the $Al_{x2}Ga_{1-x2}N$ film 20f corresponding to the second portion pq2. Thus, the semiconductor device 120 is obtained.

Third Embodiment

The embodiment relates to the method for manufacturing the semiconductor device described in reference to the first embodiment. For example, the processing described in reference to FIG. 4A to FIG. 4D is performed in the manufacturing method.

Figure 8:
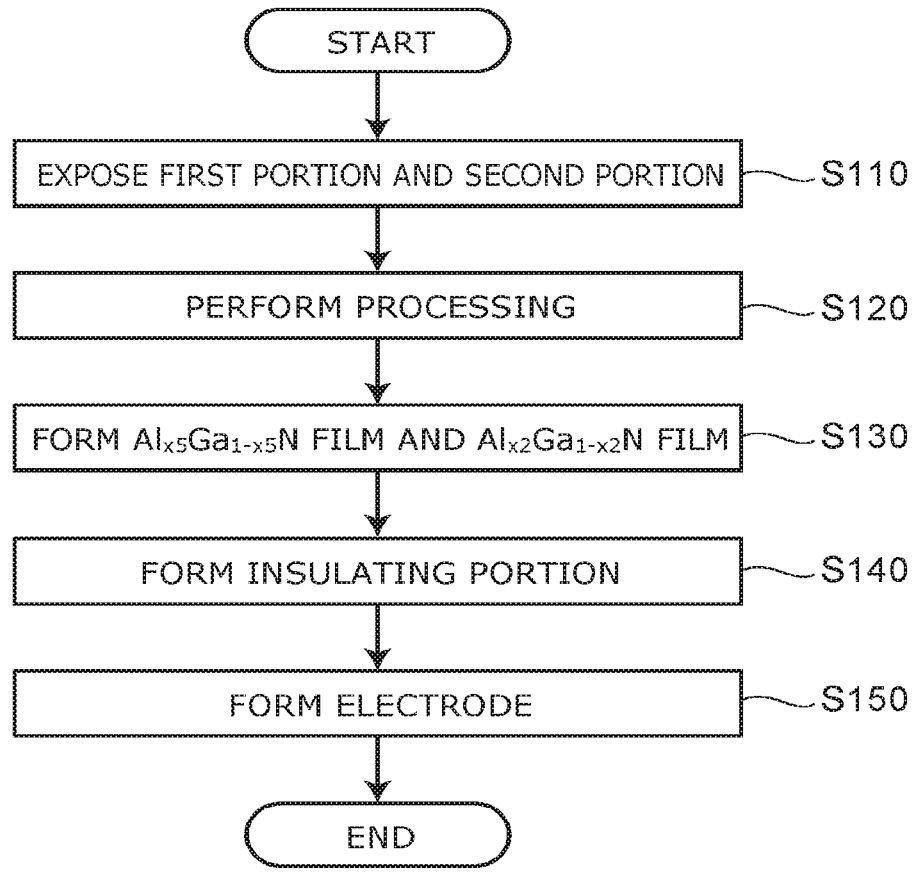
FIG. 8 is a flowchart illustrating a method for manufacturing a semiconductor device according to a third embodiment.

FIG. 8 is a flowchart illustrating the method for manufacturing the semiconductor device according to the third embodiment. As shown in FIG. 8, the first portion pp1 and the second portion pp2 of the $Al_{x1}Ga_{1-x1}N$ film 10f of the stacked body SB including the $Al_{x1}Ga_{1-x1}N$ film 10f, the $Al_{x4}Ga_{1-x4}N$ film 40f, and the $Al_{x3}Ga_{1-x3}N$ film 30f are exposed by removing a portion of the $Al_{x3}Ga_{1-x3}N$ film 30f and a portion of the $Al_{x4}Ga_{1-x4}N$ film (step S110). The $Al_{x4}Ga_{1-x4}N$ film 40f is provided between the $Al_{x1}Ga_{1-x1}N$ film 10f and the $Al_{x3}Ga_{1-x3}N$ film 30f.

The processing 92 that includes at least one selected from the group consisting of UV irradiation processing, acid treatment, and alkali treatment is performed for the first portion pp1 and the second portion pp2 (step S120).

The $Al_{x5}Ga_{1-x5}N$ film 50f ($0\leq x5<1$, $x5<x1$, and $x5<x3$) and the $Al_{x2}Ga_{1-x2}N$ film 20f ($0<x2\leq 1$, $x1<x2$, and $x5<x2$) are formed at the first portion pp1 and the second portion pp2 having this processing performed (step S130). The $Al_{x5}Ga_{1-x5}N$ film 50f is provided between the first portion pp1 and the $Al_{x2}Ga_{1-x2}N$ film 20f and between the second portion pp2 and the $Al_{x2}Ga_{1-x2}N$ film 20f. The $Al_{x3}Ga_{1-x3}N$ film 30f is provided between the first portion pp1 and the second portion pp2.

The insulating portion 80 is formed at the $Al_{x3}Ga_{1-x3}N$ film 30f (step S140).

An electrode (e.g., the third electrode 63) is formed at the insulating portion 80 (step S150).

For example, the first element may be adhered to the first portion pp1 (e.g., the surface) and the second portion pp2 (e.g., the surface) before the processing recited above (step S120).

The first element includes at least one selected from the group consisting of silicon, oxygen, carbon, and magnesium. The adhesion of the first element to the first portion pp1 (the surface) and the second portion pp2 (the surface) may be an adhesion of the first element in an atmosphere.

Fourth Embodiment

The embodiment relates to the method for manufacturing the semiconductor device described in reference to the second embodiment. For example, the processing described in reference to FIG. 7A to FIG. 7D is performed in the manufacturing method.

Figure 9:
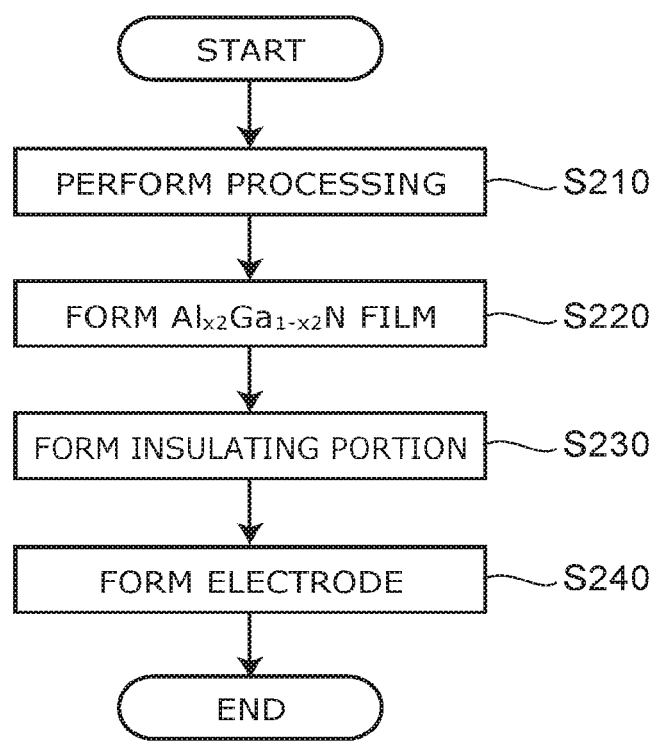
FIG. 9 is a flowchart illustrating a method for manufacturing a semiconductor device according to a fourth embodiment.

FIG. 9 is a flowchart illustrating the method for manufacturing the semiconductor device according to the fourth embodiment. As shown in FIG. 9, the processing 92 is performed for the first portion pq1 and the second portion pq2 of the $Al_{x3}Ga_{1-x3}N$ film 30f of the stacked body SB including the $Al_{x1}Ga_{1-x1}N$ film 10f, the $Al_{x4}Ga_{1-x4}N$ film 40f, and the $Al_{x3}Ga_{1-x3}N$ film 30f (step S210). The processing 92 is not performed for the third portion pq3 of the $Al_{x3}Ga_{1-x3}N$ film 30f. The processing 92 includes at least one selected from the group consisting of UV irradiation processing, acid treatment, and alkali treatment. The $Al_{x4}Ga_{1-x4}N$ film 40f is provided between the $Al_{x1}Ga_{1-x1}N$ film 10f and the $Al_{x3}Ga_{1-x3}N$ film 30f. The third portion pq3 is between the first portion pq1 and the second portion pq2.

The $Al_{x2}Ga_{1-x2}N$ film 20f is formed at the first portion pq1 and the second portion pq2 having the processing performed (step S220).

The insulating portion 80 is formed at the third portion pq3 (step S230).

An electrode (e.g., the third electrode 63) is formed at the insulating portion 80 (step S240).

The first element may be adhered to the first portion pq1 and the second portion pq2 before the processing recited above (step S210). The first element includes at least one selected from the group consisting of silicon, oxygen, carbon, and magnesium. The adhesion of the first element to the first portion pq1 (the surface) and the second portion pq2 (the surface) may be an adhesion of the first element in an atmosphere.

In the embodiments recited above, at least one of the first electrode 61 or the second electrode 62 includes, for example, aluminum, etc. The third electrode 63 includes, for example, titanium nitride. In the embodiments recited above, the insulating portion 80 includes, for example, silicon oxide. These materials are examples; and other materials may be used.

For example, in a GaN power device using regrowth, there are cases where carrier traps are formed at the regrown interface. Due to the carrier traps, for example, current collapse occurs; and the resistance is increased. In the embodiment, for example, the regrown interface is formed at a layer having a high bandgap. Or, a wide-gap layer is inserted between the channel layer and the regrown interface. For example, the carriers that flow through the channel layer are suppressed from reaching the regrown interface. For example, the generation of the carrier traps can be suppressed. For example, the current collapse is suppressed while reducing the dislocation density.

In the embodiments, for example, the first region r1 (the first position p1) that includes the first element is below the GaN/AlGaN interface. Due to the AlGaN, the carriers are suppressed from reaching the first region r1. For example, the current collapse is suppressed.

According to the embodiments, a semiconductor device and a method for manufacturing the semiconductor device can be provided in which the characteristics can be improved.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, layers, insulating portions, substrates, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing the same practicable by an appropriate design modification by one skilled in the art based on the semiconductor devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode, a direction from the second electrode toward the first electrode being aligned with a first direction;
a third electrode, a position in the first direction of the third electrode being between a position in the first direction of the first electrode and a position in the first direction of the second electrode;
a first layer including $Al_{x1}Ga_{1-x1}N$ (0<x1≤1), the first layer including first to fifth partial regions, a direction from the fourth partial region toward the first electrode, a direction from the fifth partial region toward the second electrode, and a direction from the third partial region toward the third electrode being aligned with a second direction crossing the first direction, the first partial region being between the fourth partial region and the third partial region in the first direction, the second partial region being between the third partial region and the fifth partial region in the first direction;
a second layer including $Al_{x2}Ga_{1-x2}N$ (0<x2≤1), the second layer including a first semiconductor region and a second semiconductor region, a direction from the first partial region toward the first semiconductor region and a direction from the second partial region toward the second semiconductor region being aligned with the second direction;
a third layer including $Al_{x3}Ga_{1-x3}N$ (0<x3≤1), the third layer being provided between the third partial region and the third electrode in the second direction;

a fourth layer including $Al_{x4}Ga_{1-x4}N$ ($0 \le x4 < 1$, $x4 < x1$, $x4 < x2$, and $x4 < x3$), the fourth layer being provided between the third partial region and the third layer in the second direction;

a fifth layer including $Al_{x5}Ga_{1-x5}N$ ($0 \le x5 < 1$, $x5 < x1$, $x5 < x2$, and $x5 < x3$), the fifth layer including a first intermediate region and a second intermediate region, the first intermediate region being provided between the first partial region and the first semiconductor region in the second direction, the second intermediate region being provided between the second partial region and the second semiconductor region in the second direction, the third layer being provided between the first intermediate region and the second intermediate region in the first direction; and an insulating portion including a first insulating region provided between the third layer and the third electrode in the second direction, a first concentration of a first element at a first position inside the first partial region being higher than a third concentration of the first element at a third position inside the third partial region, a direction from the third position toward the first position being aligned with the first direction, the first element including at least one selected from the group consisting of silicon, oxygen, carbon, and magnesium.

2. The device according to claim 1, wherein
the first layer further includes a sixth partial region and a seventh partial region,
the fourth layer includes a first portion and a second portion,
the first portion is between the first intermediate region and the second intermediate region in the first direction,
the second portion is between the sixth partial region and the seventh partial region in the first direction,
the first position is between the first partial region and the sixth partial region in the second direction,
a second position is between the second partial region and the seventh partial region in the second direction, and
a second concentration of the first element at the second position is higher than the third concentration.

3. The device according to claim 1, wherein
the first layer further includes a sixth partial region and a seventh partial region,
at least a portion of the third partial region is between the sixth partial region and the seventh partial region in the first direction,
the first position is between the first partial region and the sixth partial region in the second direction,
a second position is between the second partial region and the seventh partial region in the second direction, and
a second concentration of the first element at the second position is higher than the third concentration.

4. The device according to claim 1, wherein a thickness along the second direction of the fourth layer is thinner than a thickness along the second direction of the first intermediate region and thinner than a thickness along the second direction of the second intermediate region.

5. The device according to claim 1, wherein at least a portion of the third electrode is between the first semiconductor region and the second semiconductor region in the first direction.

6. The device according to claim 1, wherein
the insulating portion further includes a second insulating region and a third insulating region, the first semiconductor region is provided between the second insulating region and the first intermediate region in the second direction, and
the second semiconductor region is provided between the third insulating region and the second intermediate region in the second direction.

7. The device according to claim 6, wherein
the insulating portion further includes a fourth insulating region and a fifth insulating region,
the fourth insulating region is provided between the first semiconductor region and at least a portion of the third electrode in the first direction, and
the fifth insulating region is provided between the second semiconductor region and at least a portion of the third electrode in the first direction.

8. The device according to claim 7, wherein
the third electrode includes first to third electrode regions,
the fourth insulating region is between the first electrode region and a portion of the third layer in the second direction, and
the fifth insulating region is between the second electrode region and another portion of the third layer in the second direction.

9. A semiconductor device, comprising:
a first electrode;
a second electrode, a direction from the second electrode toward the first electrode being aligned with a first direction;
a third electrode, a position in the first direction of the third electrode being between a position in the first direction of the first electrode and a position in the first direction of the second electrode;
a first layer including $Al_{x1}Ga_{1-x1}N$ ($0 < x1 \le 1$), the first layer including first to fifth partial regions, a direction from the fourth partial region toward the first electrode, a direction from the fifth partial region toward the second electrode, and a direction from the third partial region toward the third electrode being aligned with a second direction crossing the first direction, the first partial region being between the fourth partial region and the third partial region in the first direction, the second partial region being between the third partial region and the fifth partial region in the first direction;
a second layer including $Al_{x2}Ga_{1-x2}N$ ($0 < x2 \le 1$), the second layer including a first semiconductor region and a second semiconductor region, a direction from the first partial region toward the first semiconductor region and a direction from the second partial region toward the second semiconductor region being aligned with the second direction;
a third layer including $Al_{x3}Ga_{1-x3}N$ ($0 < x3 \le 1$), the third layer including first to third intermediate regions, the first intermediate region being provided between the first partial region and the first semiconductor region in the second direction, the second intermediate region being provided between the second partial region and the second semiconductor region in the second direction, the third intermediate region being provided between the third partial region and the third electrode in the second direction;
a fourth layer including $Al_{x4}Ga_{1-x4}N$ ($0 \le x4 < 1$, $x4 < x1$, $x4 < x2$, and $x4 < x3$), the fourth layer being provided between the first partial region and the first intermediate region, between the second partial region and the second intermediate region, and between the third partial region and the third intermediate region in the second direction; and an insulating portion including a first insulating region provided between the third layer and the third electrode in the second direction, a first concentration of the first element at a first position inside a region including the first intermediate region and the first semiconductor region being higher than a third concentration of the first element at a third position inside the third intermediate region, a direction from the third position toward the first position being aligned with the first direction, the first element including at least one selected from the group consisting of silicon, oxygen, carbon, and magnesium.

10. The device according to claim 9, wherein a thickness along the second direction of the third intermediate region is thinner than a sum of a thickness along the second direction of the first intermediate region and a thickness along the second direction of the first semiconductor region and thinner than a sum of a thickness along the second direction of the second intermediate region and a thickness along the second direction of the second semiconductor region.

11. The device according to claim 9, wherein at least a portion of the third electrode is between the first semiconductor region and the second semiconductor region in the first direction.

12. The device according to claim 9, wherein
the insulating portion further includes a second insulating region and a third insulating region, the first semiconductor region is provided between the second insulating region and the first intermediate region in the second direction, and the second semiconductor region is provided between the third insulating region and the second intermediate region in the second direction.

13. The device according to claim 12, wherein
the insulating portion further includes a fourth insulating region and a fifth insulating region, the fourth insulating region is provided between the first semiconductor region and at least a portion of the third electrode in the first direction, and the fifth insulating region is provided between the second semiconductor region and at least a portion of the third electrode in the first direction.

14. The device according to claim 1, wherein
the first concentration is not less than $1\times10^{18}/cm^3$ and not more than $1\times10^{19}/cm^3$, and the third concentration is less than $1\times10^{18}/cm^3$.

15. The device according to claim 14, wherein the third concentration is less than $5\times10^{17}/cm^3$.

16. The device according to claim 1, wherein a carrier concentration at the first position is less than $1\times10^{18}/cm^3$.

17. The device according to claim 1, wherein the semiconductor device performs a normally-OFF operation.

* * * * *